(12) United States Patent
Petrovic et al.

(10) Patent No.: US 8,369,820 B2
(45) Date of Patent: Feb. 5, 2013

(54) FREQUENCY MULTIPLIER DEVICE

(75) Inventors: Branislav A. Petrovic, La Jolla, CA (US); Maxim Ashkenasi, La Jolla, CA (US); Andre Basovich, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 984 days.

(21) Appl. No.: 11/850,374

(22) Filed: Sep. 5, 2007

(65) Prior Publication Data
US 2009/0061810 A1     Mar. 5, 2009

(51) Int. Cl.
H04B 1/16     (2006.01)

(52) U.S. Cl. ......... 455/339; 455/334; 455/323; 455/324

(58) Field of Classification Search .................. 455/323, 455/313, 339, 324; 348/735
See application file for complete search history.

(56) References Cited

U.S. PATENT DOCUMENTS

| | | | |
|---|---|---|---|
| 4,303,893 A | 12/1981 | Goldberg | |
| 4,336,505 A | 6/1982 | Meyer | |
| 4,368,354 A * | 1/1983 | Furihata et al. ............... | 348/485 |
| 4,677,690 A | 6/1987 | Reed | |
| 4,755,761 A | 7/1988 | Ray et al. | |
| 4,766,392 A | 8/1988 | Moore | |
| 4,852,123 A * | 7/1989 | Bickley et al. ................ | 375/223 |
| 4,918,405 A | 4/1990 | Herleikson | |
| 4,918,747 A | 4/1990 | Bekooij | |
| 4,994,767 A | 2/1991 | Hawkes | |
| 5,014,352 A | 5/1991 | Chung et al. | |
| 5,369,790 A * | 11/1994 | Yokota ....................... | 455/164.1 |
| 5,412,351 A | 5/1995 | Nystrom et al. | |
| 5,418,489 A | 5/1995 | Traylor et al. | |
| 5,584,068 A | 12/1996 | Mohindra et al. | |
| 5,661,439 A | 8/1997 | Watkins et al. | |
| 5,703,527 A | 12/1997 | Iwasaki | |
| 5,736,872 A | 4/1998 | Sharma et al. | |

(Continued)

FOREIGN PATENT DOCUMENTS

| | | | |
|---|---|---|---|
| EP | 0665651 | A2 | 8/1995 |
| EP | 0749207 | A2 | 12/1996 |

(Continued)

OTHER PUBLICATIONS

PCT International Search Report for PCT/US08/74591—dated Nov. 12, 2008.

(Continued)

*Primary Examiner* — Temesgh Ghebretinsae
*Assistant Examiner* — Richard Chan
(74) *Attorney, Agent, or Firm* — Susan R. Payne

(57) ABSTRACT

A frequency multiplier device comprises a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency; and a frequency divider having a dividing ratio N, the frequency divider configured to output a divided signal, wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$.

25 Claims, 8 Drawing Sheets

U.S. PATENT DOCUMENTS

| | | | |
|---|---|---|---|
| 5,963,059 A | 10/1999 | Partovi et al. | |
| 5,970,053 A * | 10/1999 | Schick et al. | 370/252 |
| 6,385,442 B1 * | 5/2002 | Vu et al. | 455/318 |
| 6,404,293 B1 | 6/2002 | Darabi et al. | |
| 6,456,143 B2 | 9/2002 | Masumoto et al. | |
| 6,459,743 B1 * | 10/2002 | Lipka | 375/329 |
| 6,463,268 B2 * | 10/2002 | Tomiyama | 455/302 |
| 6,487,398 B1 * | 11/2002 | Nobbe et al. | 455/118 |
| 6,512,472 B1 * | 1/2003 | Smith et al. | 341/155 |
| 6,516,183 B1 | 2/2003 | Hellmark | |
| 6,574,462 B1 * | 6/2003 | Strange | 455/318 |
| 6,665,368 B2 | 12/2003 | Sahm | |
| 6,728,527 B2 | 4/2004 | Casagrande et al. | |
| 6,760,577 B2 * | 7/2004 | Li | 455/323 |
| 6,785,346 B1 | 8/2004 | Birkett et al. | |
| 6,788,157 B2 | 9/2004 | Clarke | |
| 6,847,255 B2 | 1/2005 | Petrovic | |
| 6,876,844 B1 * | 4/2005 | Wong | 455/316 |
| 6,977,556 B1 | 12/2005 | Petrovic et al. | |
| 6,993,295 B2 * | 1/2006 | Gilmore | 455/76 |
| 7,035,750 B2 * | 4/2006 | de Obaldia et al. | 702/117 |
| 7,088,981 B2 * | 8/2006 | Chang | 455/326 |
| 7,116,945 B2 * | 10/2006 | Moloudi et al. | 455/78 |
| 7,139,547 B2 * | 11/2006 | Wakayama et al. | 455/333 |
| 7,139,548 B2 * | 11/2006 | Hayashi et al. | 455/333 |
| 7,242,916 B2 * | 7/2007 | Oosawa et al. | 455/245.1 |
| 7,263,149 B2 * | 8/2007 | Ware et al. | 375/354 |
| 7,277,623 B2 * | 10/2007 | Poppa | 386/204 |
| 7,386,286 B2 * | 6/2008 | Petrovic et al. | 455/165.1 |
| 7,433,667 B2 * | 10/2008 | Seippel et al. | 455/313 |
| 7,495,484 B1 | 2/2009 | Petrovic | |
| 7,519,348 B2 * | 4/2009 | Shah | 455/285 |
| 2001/0043109 A1 | 11/2001 | Masumoto et al. | |
| 2003/0045263 A1 * | 3/2003 | Wakayama et al. | 455/323 |
| 2003/0095201 A1 | 5/2003 | Devaney et al. | |
| 2006/0014513 A1 * | 1/2006 | Uozumi et al. | 455/323 |
| 2006/0246861 A1 | 11/2006 | Dosanjh et al. | |
| 2006/0281429 A1 | 12/2006 | Kishi et al. | |
| 2007/0117507 A1 * | 5/2007 | Wakayama et al. | 455/3.02 |
| 2008/0164916 A1 | 7/2008 | Petrovic et al. | |
| 2008/0258783 A1 | 10/2008 | Petrovic | |

FOREIGN PATENT DOCUMENTS

| | | |
|---|---|---|
| EP | 0863616 A1 | 9/1998 |
| EP | 1313209 A1 | 5/2003 |
| EP | 1313210 A1 | 5/2003 |

OTHER PUBLICATIONS

Ciubotaru, A.A., "Technique for Acheiving Wideband 1/2 Regenerative Frequency Division Using LSB-SSB Modulation", Electronics Letters, vol. 31, No. 6, Mar. 16, 1995.

Honjo, Kazuhiko, et al., "Novel Design Approach for X-Band GaAs Monolithic Analog 1/4 Frequency Divider", IEEE Transacations on Microwave Theory and Techniques, vol. MIT-34, No. 4, Apr. 1986.

Przyslupski, Robert, "Regenerative Frequency Dividers: A Tutorial Paper", Apr. 9, 2011.

Matsuoka, Hiroto, et al., "A 5-GHz Frequency-Doubling Quadrature Modulator with a Ring-Type Local Oscillator", IEEE Journal of Solid-State Circuits, vol. 34, No. 9, Sep. 1999.

* cited by examiner

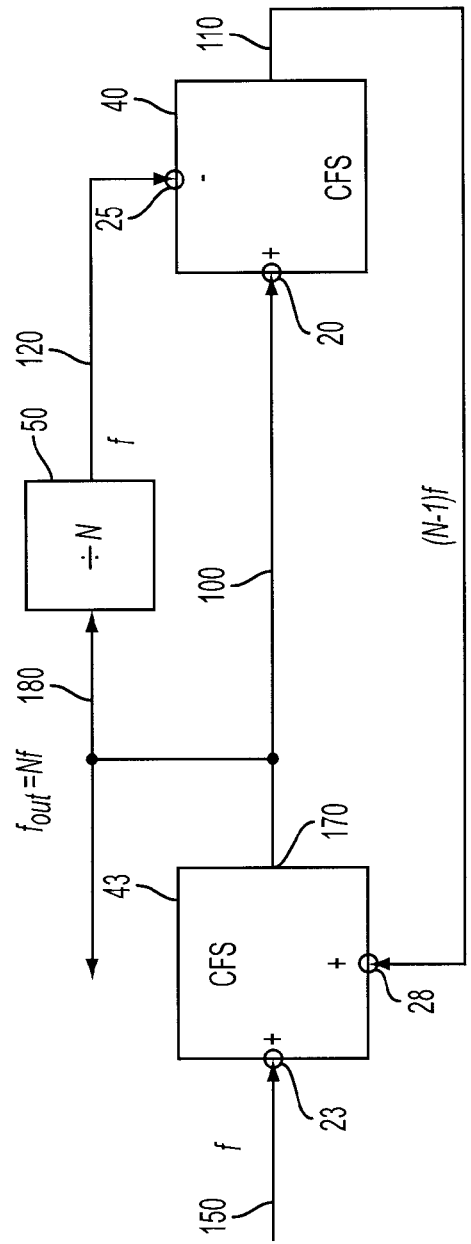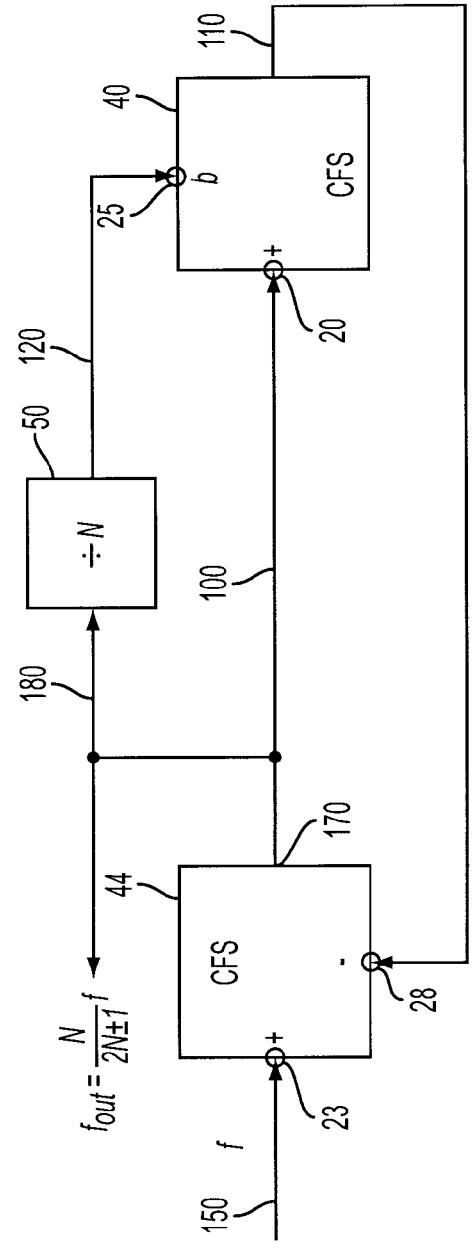

FREQUENCY MULTIPLIER DEVICE

BACKGROUND OF THE INVENTION

1. Related Applications and Patents

U.S. patent application Ser. No. 11/621,357 (filed on Jan. 9, 2007) which is entitled "BROADBAND LOW NOISE COMPLEX REGENERATIVE FREQUENCY DIVIDERS" and Ser. No. 11/737,384 (filed on Apr. 19, 2007) which is entitled "BROADBAND LOW NOISE COMPLEX FREQUENCY MULTIPLIERS" are herein incorporated by reference. U.S. Patent Publication No. 20060057996 entitled "High frequency low noise phase-frequency detector and phase noise reduction method and apparatus" and U.S. Pat. No. 6,977,556 entitled "Rational frequency synthesizers" are also related to the subject matter and are herein incorporated by reference as well.

2. Field of the Invention

This invention relates to a device for performing frequency multiplication which exhibits low phase noise and low broadband noise. More particularly, the present invention employs integer, fractional and/or rational multiplication by using an array of Complex Frequency Shifters (CFS's) in combination with signal routing.

3. Background of the Related Art

Frequency multipliers along with frequency dividers are among the very essential building blocks in frequency generation and synthesis devices and are extensively used in these and many other applications. Signal sources with very low phase noise are increasingly more in demand as the frequencies utilized by such devices continue to increase along with the overall performance requirements. For example, the jitter of the clock caused by phase noise and broadband noise limits the achievable signal-to-noise ratio "SNR" in high speed ADCs/DACs. Reducing the clock jitter improves the achievable performance and allows higher frequency operation in demanding applications. This is one example among many where a low noise frequency multiplier allows for improved operating performance.

Numerous types of frequency multipliers are known in the art (e.g., frequency doublers), and include both analog and digital based devices. Generally speaking, analog multipliers have some advantages over digital multipliers in that they can operate at higher frequencies, achieve higher multiplication ratios, have lower phase noise and lower broadband noise, and consume less power. Analog multipliers can typically be divided in two categories: direct analog multipliers and the multipliers based on multiplying phase-lock loops or other schemes employing closed loop feedback systems or injection-locking mechanisms. As explained in detail below, the present invention falls within the category of direct analog multipliers.

Direct analog multipliers can further be divided into multipliers based on parametric nonlinearities of components, for instance nonlinear conductance or capacitive reactance and those using multiplying devices, such as mixers. Discrete circuits using nonlinearities of components such as diodes or transistors have been extensively used in the prior art, but typically need to be tuned to a specific frequency range or spectral component and are narrow-band. Mixer-based multipliers are a more systematic way of performing frequency multiplication, and provide wider bandwidth capabilities and have potential for larger multiplication ratios.

While devices for performing frequency multiplication by factorial of two (2) (for instance 2, 4, 8 . . . ) have been addressed in the prior art, that is not the case for frequency multiplication by an arbitrary integer factors. Also, generally speaking, devices for performing frequency multiplication by fractional or rational factor have not been addressed in the prior art. Further, the prior art fails to provide the rational frequency multiplier and synthesizer with low phase and broadband noise. Thus, there remains a need for a frequency multiplication device which provides for multiplication by integer, fractional and/or rational factors, which exhibits improved SNR and addresses the other limitations of the prior art devices noted above.

SUMMARY OF THE INVENTION

It is one objective of the present invention to provide a fixed or a programmable frequency multiplier device which allows for multiplication by integer or fractional factors, which exhibits very low phase noise, and which is suitable for use to provide dynamically programmable sources in multi-band and other systems achieving far lower phase noise than with traditional synthesizers.

It is another objective of the present invention to provide a fixed or a programmable frequency multiplier device by integer or fractional factors which achieves very wide frequency range of operation from low frequencies near DC to very high frequencies close to the transition frequency $f_T$ of the active devices utilized.

Another objective of the present invention is to provide the output quadrature components I and Q of the multiplied signal for use as a source of quadrature signals to be utilized by other components in the system.

Yet another objective of the present invention is to provide a fixed or a programmable frequency multiplier by integer or fractional factors which provides for fast acquisition of the input signal and provides the in-phase and quadrature components of the output multiplied signal with minimal delay, using little or no filtering thus not slowing down the acquisition and multiplication process.

It is further an objective of the present invention to provide a fixed or a programmable frequency multiplier by integer or fractional factors which achieves low radiated and conducted EMI emissions in order to reduce unwanted signal coupling or ingress into other circuits in densely populated designs, such as in monolithic ICs.

It is yet another objective of the present invention to achieve the above objectives in a manner enabling a simple design and implementation in integrated circuits (ICs) without using external components such as bulky coils and capacitors and without a need for any adjustments, tweaking or calibration during production.

Accordingly, the present invention relates to frequency multiplier device, comprising a first signal combiner having a first port for receiving a first input signal having a first frequency $f_1$ and a second port for receiving a second input signal having a second frequency $f_2$, the first signal combiner configured to provide an output signal having either the sum of the first frequency and second frequency or the difference of the first frequency and second frequency; and a frequency divider having a dividing ratio N, the frequency divider configured to output a divided signal, wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$.

The present invention also relates to frequency multiplier device comprising a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency, a frequency divider having a dividing ratio N, the frequency divider configured to output a divided signal, wherein the divided signal from the frequency divider is coupled to the second port of the first signal combiner, the frequency divider is configured to receive the first input signal, and the output signal from the first signal combiner has a frequency of $((N\pm1)/N) \times f_1$.

Further, the present invention relates to a rational frequency multiplier comprising an integer multiplier having a multiplication ratio M and configured to receive a signal having a frequency $f_{in}$ and to output an integer multiplied signal having a frequency $M \times f_{in}$; a fractional multiplier having a multiplication ratio P/Q and configured to receive the signal having the frequency $f_{in}$ and to output an fractional multiplied signal having a frequency $P/Q \times f_{in}$; and a signal combiner configured to combine the integer multiplied signal and the fractional multiplied signal and to output an rational multiplied signal having either a sum frequency $(M+P/Q) \times f_{in}$ or a difference frequency $(M-P/Q) \times f_{in}$.

Among other advantages as noted below, the frequency multiplier device of the present invention provides a low noise device suitable for IC integration and capable of covering an extremely wide frequency range from near DC to near maximum frequency of operation of active devices (e.g. close to a transition frequency $f_T$ of IC processes) in the multi-GHz range, thus offering significant performance advantages in frequency synthesis as a reference signal, stand-alone LO signal source or a low jitter clock for ADCs or DACs in many applications ranging from high speed digital communications in CATV to wireless communications and other modern consumer and commercial electronics devices.

Additional advantages of the present invention will become apparent to those skilled in the art from the following detailed description of exemplary embodiments of the present invention.

The invention itself together with further objects and advantages, can be better understood by reference to the following detailed description and the accompanying drawings.

BRIEF DESCRIPTION OF THE DRAWINGS

FIG. 1b simplified block diagram of the CFS multiplier illustrated in FIG. 1a.

FIG. 7 is an exemplary block diagram of a sixth embodiment of a frequency multiplier operable for performing a regenerative integer frequency multiplication in accordance with the present invention.

FIG. 8 is an exemplary block diagram of a seventh embodiment of a frequency multiplier operable for performing a regenerative fractional frequency multiplication in accordance with the present invention.

DETAILED DESCRIPTION OF THE INVENTION

Figure 1A:
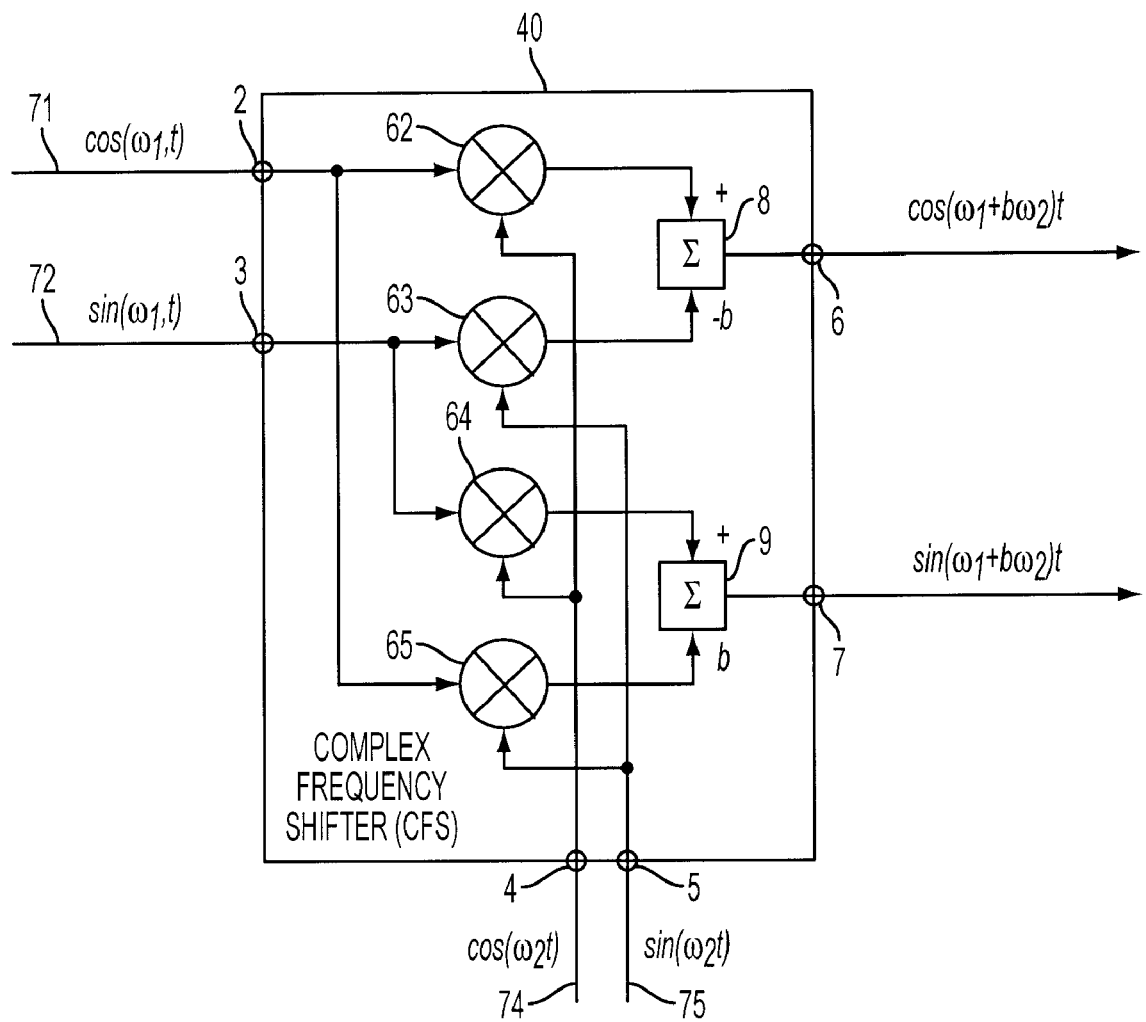
FIG. 1a is an exemplary block diagram of an embodiment of a complex frequency shifter "CFS" in accordance with the present invention.

FIG. 1a is an exemplary block diagram of the complex frequency shifter (CFS) 40 utilized in the present invention. In general, the CFS circuit 40 provides the sum or the difference of two frequencies. When a first complex signal having an in-phase component $\cos(\omega_1 t)$ and a quadrature component $\sin(\omega_1 t)$ is applied to the input port 2 and 3, respectively, and a second complex signal having an in-phase component $\cos(\omega_2 t)$ and a quadrature component $\sin(\omega_2 t)$ is applied to the input ports 4 and 5, respectively, the CFS circuit 40 performs frequency summation or subtraction. The sign "b" inside the box 40 indicates that the frequencies at the corresponding ports are added in case of b=1 and are subtracted in case of b=−1 at the output. The CFS circuit 40 provides at the output ports the output signal with the frequency $\omega_1 + b\omega_2$. If b=1, then the output signal having the sum frequency $\omega_1 + \omega_2$ will appear at the output port 6 and 7, and if b=−1, then the output signal having subtract frequency $\omega_1 - \omega_2$ will appear at the output port 6 and 7. In the given embodiment, the output signal is also complex, having two components in phase and quadrature i.e., $\cos(\omega_1 \pm \omega_2)t$ and $\sin(\omega_1 \pm \omega_2)t$.

The value of b may be physically determined by the internal polarity of the signal at the output of a multiplier 63 or 65 coupled to the summing circuit 8 or 9, respectively. In the given embodiment, the polarity of the multiplexer output signal directly determines the value of b, that is the output signal sets the value of b to either +1 or −1. By changing (or reversing) the polarity of this signal, the value of b can be changed. The value of b may be programmed or selected by using a controllable signal polarity switch. There are numerous ways to change the signal polarity known in the art. For example, the polarity may be changed by utilizing an inverter, which can be either engaged or bypassed. Or, with differential circuits, cross-switching the + and − terminals, that is, "swapping" the two "leads" of the differential signal can accomplish the polarity reversal function.

More specifically, the CFS circuit 40 includes four individual multipliers 62, 63, 64 and 65, wherein multipliers 62 and 65 receive a first component 71 of a first input signal, and multipliers 63 and 64 receive a second component 72 of the first input signal. Further, multipliers 62 and 64 receive a first component 74 of a second input signal, and multipliers 63 and 65 receive a second component 75 of the second input signal. For example, the first component 71 of the first input signal and the second component 72 of the first input signal may be $\cos(\omega_1 t)$ and $\sin(\omega_1 t)$, respectively, and the first component 74 of the second input signal and the second component 75 of the second input signal may be $\cos(\omega_2 t)$ and $\sin(\omega_2 t)$, respectively.

The outputs of multipliers 62 and 63 are coupled to a first summer circuit 8 and the outputs of multipliers 64 and 65 are coupled to a second summer circuit 9. The outputs of the summer circuits 8 and 9 represent the output of the CFS 40. It is noted that a summer may operate as an adder or a subtracter of signals. It is also noted that other circuit configurations can also be utilized to implement the functionality of the CFS 40.

Turning to the operation, the CFS 40 is configured to perform a complex up-conversion to the upper sideband "USB" and/or the lower side sideband "LSB." In other words, whether to produce the sum or the difference of the two input frequencies is determined by the polarity choice of the signals at the summers 8 and 9, as described above. For the desired up-conversion, the summer 8 provides the difference signal, while the summer 9 provides the sum signal as shown in FIG. 1a (b=+1). On the other hand, for the LSB, the summer 8 provides the sum signal, while the summer 9 provides the difference signal as shown in FIG. 1a (b=−1). As noted, the CFS 40 has two complex inputs (i.e., inputs (2 and 3) and (4 and 5)) and one complex output (6 and 7). Each complex input consists of a pair of ports: the in-phase I port and the quadrature Q port. The complex output port also consists of a I port (6) and a Q port (7). The first complex input is at ports 2 and 3, where port 2 is the I input port and port 3 is the Q input port. The second complex input is at ports 4 and 5, port 4 being the I input port and port 5 the Q input port. The complex output consists of port 6, the I output, and of port 7, the Q output.

The frequency summation/subtraction by the CFS 40 is realized by connecting the input ports 2 and 3 of the CFS 40 to the first input signal and the other pair of input ports 4 and 5 to the second input signal, respectively, as shown in FIG. 1a. It is noted that the CFS 40 of the given embodiment utilizes two input signals in quadrature to operate. These signals may be provided from an external source to the circuit. When a first complex signal having the in-phase component $\cos(\omega_1 t)$ and the quadrature component $\sin(\omega_1 t)$ and a second complex signal having the in-phase component $\cos(\omega_2 t)$ and the quadrature component $\sin(\omega_2 t)$ are applied to the input ports of the CFS circuit 40 of FIG. 1a, the circuit CFS 40 performs frequency summation or subtraction and at the output port provides the output signal having the frequency $\omega_1 \pm \omega_2$. The output signal is also complex and has two components: the in-phase multiplied signal $\cos(\omega_1 \pm \omega_2)t$ at port 6 and the quadrature multiplied signal $\sin(\omega_1 \pm \omega_2)t$ at port 7.

Specifically, with the input signal expressed in the phasor form using Euler's formula:

$$e^{j\omega_1 t} = \cos\omega_1 t + j\sin\omega_1 t \text{ at complex port (2, 3), and} \quad (1)$$

$$e^{j\omega_2 t} = \cos\omega_2 t + j\sin\omega_2 t \text{ at complex port (4, 5),} \quad (2)$$

the summed signal at the output of the CFS circuit 40 can also be expressed in a complex form:

$$e^{j(\omega_1 \pm \omega_2)t} = \cos(\omega_1 \pm \omega_2)t + j\sin(\omega_1 \pm \omega_2)t \text{ at complex port (6,7)} \quad (3).$$

Equations (1), (2) and (3) express the canonical operation of the CFS circuit 40, which takes the input complex signals $e^{j\omega_1 t}$ and $e^{j\omega_2 t}$, operates on its argument and delivers the sum or the difference complex signal $e^{j(\omega_1 \pm \omega_2)t}$ at the output. The magnitude of the output signal is unity, equal to that of the input, representing a property of unity gain of the CFS circuit 40. The real and imaginary components of the output complex signal in Eq. (3), representing the in-phase I and the quadrature Q components of the multiplied output, are in quadrature. The phases of the output components with respect to each other and with respect to the input signals are defined per Eqs. (1), (2) and (3): the output signal at port 6 providing the output's real component $\cos(\omega_1 \pm \omega_2)t$, for example, is in-phase (0°) with respect to the input in-phase component $\cos(\omega_1 t)$ or $\cos(\omega_2 t)$; and the signal at output port 7 of $\sin(\omega_1 \pm \omega_2)t$, for example, lags behind the in-phase signal at port 6 by 90°. In the actual circuit, a small phase delay of the output signal with respect to the input signals will occur due to the propagation delay time $\tau$ through the circuit.

The provision of the quadrature components at the output of the CFS circuit 40 represents a powerful feature of the present invention. More specifically, the I and Q quadrature components of the multiplied signal may be utilized as a quadrature source for other elements contained within the system. For example, the quadrature signal output by the CFS circuit 40 can be used to drive I, Q modulator stage in a transmitter application, or I, Q demodulator in a receiver application as a quadrature local oscillator (LO), replacing the often-utilized poly-phase filters commonly used to derive quadrature components.

Considering a case with ideal operation (i.e., a pure multiplied sinusoidal signal per Eq. (3)), there would be no unwanted images or sidebands at the output and no additional filtering would be required, the principal advantage of the complex multiplication compared with a single-dimensional operation. Of course, a pure sine-wave per Eq. (3) implying a perfect linearity, signal balance and isolation generally cannot currently be realized. In the practical circuit design, harmonic distortion will typically occur due to nonlinearity in multipliers 62-65. The level of distortion typically depends on the nonlinearity in conjunction with the applied signal levels. In general, the level of higher frequency harmonic energy with the present invention circuit will be far below the desired signal, easily a few orders of magnitude lower. In addition to providing a spectrally cleaner signal, low harmonic content with the present invention circuit will result in low radiated and conducted EMI emissions advantageous in reducing or eliminating unwanted signal coupling or ingress into other circuits in densely populated designs, such as in monolithic ICs.

It is further noted that due to other circuit imperfections such as imbalances of amplitude and phase in the I and Q arms, there may be other unwanted terms, such as images, input signal leakages, etc., present at the output signal. The quality of the output signal will also depend on the phase and amplitude balance of the input quadrature signals provided externally to the circuit. In a typical IC circuit, the image suppression and the input signal leakage terms may be on the order of 35 dBc to 40 dBc below the desired signal. Depending on the system requirements and the application, some filtering of these terms may be necessary.

Figure 1B:
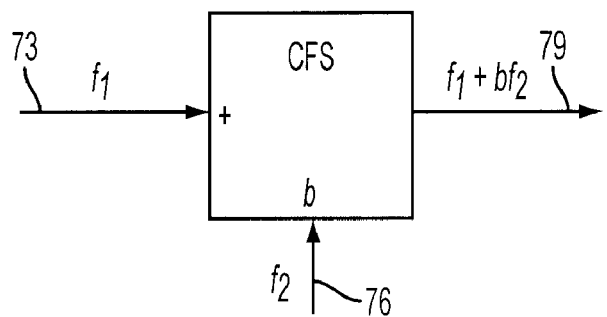

As noted above, FIG. 1b is a simplified representation of the CFS signal combiner circuit shown in FIG. 1a, depicting the basic summation property of the CFS circuit 40 in a simplified manner. Referring to FIG. 1b, the mixer and summer circuits of the CFS circuit are represented as a box labeled "CFS" 40. In addition, the complex input and output ports, consisting of two ports each in FIG. 1a, are represented with a single line for the purpose of simplification in the diagram of FIG. 1b. It should be noted that each of the lines 73, 76 and 79 represents a complex single line, consisting of two different signal lines, the in-phase (or cosine) and the quadrature (or sine) signal line, each connected to the corresponding I, Q port pair of the CFS circuit 40 of FIG. 1a. The sign "b" inside the box 40 indicates that the frequencies at the corresponding ports are added in case of b=1 and are subtracted in case of b=−1 at the output. As shown, the input frequency $f_1$ at the input 73 and $f_2$ at the input 76 are added to $f_1+f_2$ or subtracted to $f_1-f_2$ at the output 79.

Figure 2:
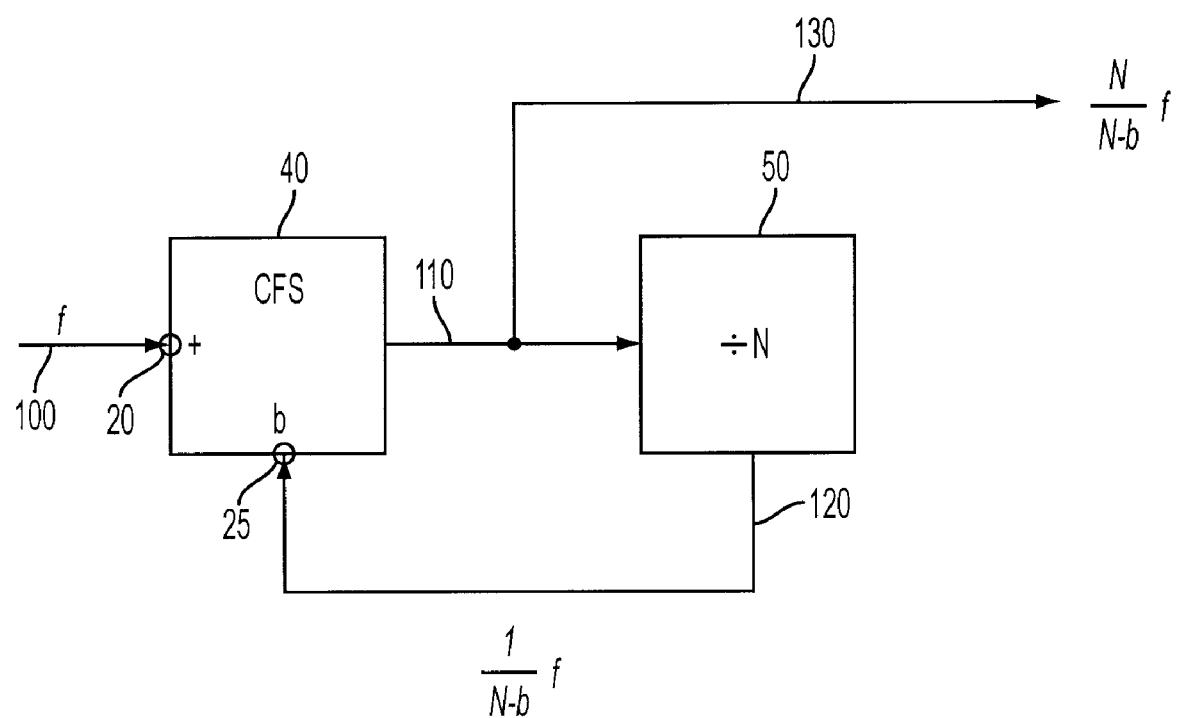
FIG. 2 is an exemplary block diagram of a first embodiment of a frequency multiplier operable for performing a regenerative fractional frequency multiplication in accordance with the present invention.

The quadrature signal can also be utilized in conjunction with a frequency divider having a dividing ratio N, for example as shown in FIG. 2, which is an example of a first embodiment of the present invention, to obtain a fractional frequency multiplier device. In FIG. 2, a first signal combiner, for example a CFS 40, and a frequency divider 50 are coupled with feedback connection 120. The CFS 40 has a first port 20 for receiving a complex input signal 100 having a frequency f and a second port 25 for receiving a feedback signal 120. The output 110 from the CFS 40 is coupled to the frequency divider 50. When the frequency divider 50 has a dividing ratio N, the feedback signal 120 has a frequency $(1/(N-b))\times f$ and an output signal 130 has a frequency $(N/(N-b))\times f$. It is noted that the CFS circuit shown in FIG. 1*a* may be used as the CFS circuit 40 in this embodiment.

For the USB configuration (b=+1), the ratio N of the divider 50 has to be greater than 1 (N>1). With an integer value of N, the device shown in FIG. 2 may produce a fractional output frequency equal to $(N/(N-1))\times f$. The ratio N of the frequency divider 50 may be fixed or programmable. If the frequency divider is programmable, then the fractional frequency multiplier device shown in FIG. 2 is also programmable. It is noted that N itself may be a fractional number.

For the LSB configuration (b=−1), the ratio N of the frequency divider is not restricted. With an integer value of N, the device of FIG. 2 may produce a fractional output frequency equal to $(N/(N+1))\times f$. The ratio N of the frequency divider 50 may be fixed or programmable. If the frequency divider is programmable, then the fractional frequency multiplier device shown in FIG. 2 is also programmable. It is noted that N itself may be a fractional number. If N=1/K, where K is an integer, the frequency divider may operate as an integer frequency multiplier, then the fractional frequency multiplier device shown in FIG. 2 may still produce an output signal having a fractional output frequency $(1/(K+1))\times f$.

Figure 3:
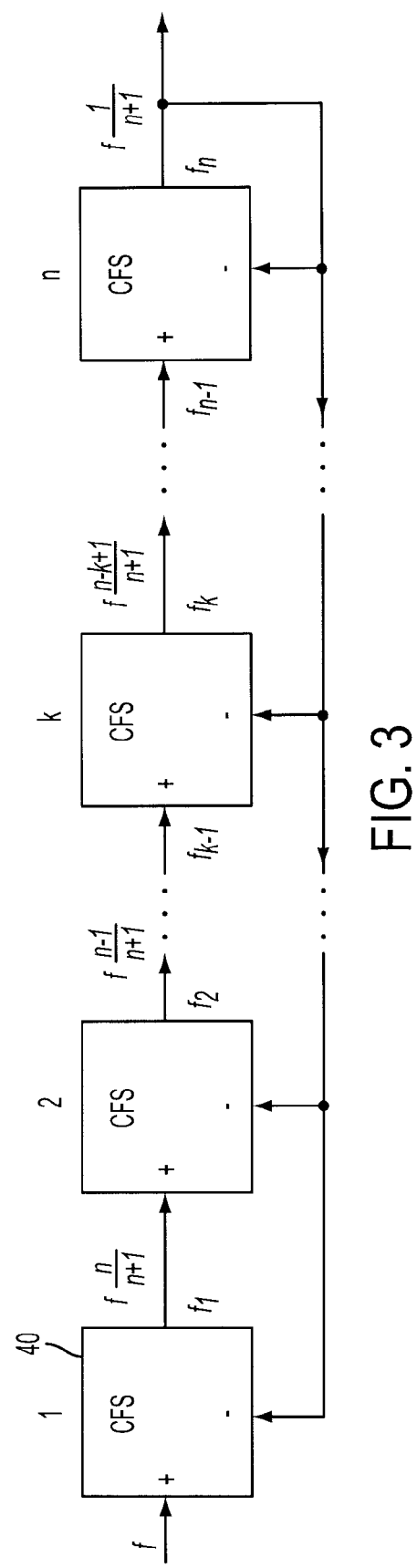
FIG. 3 is an exemplary block diagram of a second embodiment of a frequency multiplier operable for performing a regenerative fractional frequency multiplication in accordance with the present invention.

FIG. 3 shows an example of a second embodiment of the present invention, to obtain a fractional regenerative frequency multiplier device. In FIG. 3, a plurality of CFS's 40, configured for LSB conversion (b=−1), are arranged in a cascade chain with a common feedback connection from the output of the cascade to the second port of each CFS. The device may produce a series of fractional output frequencies that are multiples of 1/(1+n) times the input frequency, where n is the number of CFS blocks.

Figure 4:
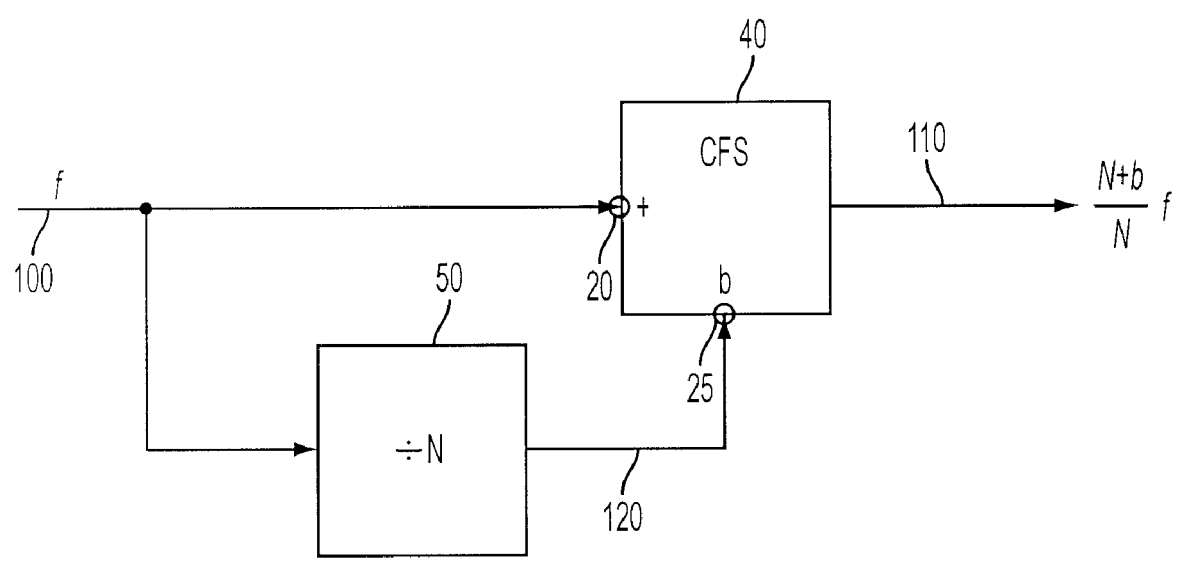
FIG. 4 is an exemplary block diagram of a third embodiment of a frequency multiplier operable for performing a regenerative fractional frequency multiplication in accordance with the present invention.

A fractional frequency multiplier device may also be obtained using a signal combiner and a frequency divider with feedforward connection. FIG. 4 shows an example of a third embodiment of the present invention, to obtain a fractional frequency multiplier device. In FIG. 4, a first signal combiner, for example a CFS 40, and a frequency divider 50 are coupled with a feedforward connection 120. The CFS has a first port 20 for receiving a complex input signal 100 having a frequency f and a second port 25 for receiving a feedforward signal 120. The input signal 100 is also coupled to the frequency divider 50. When the frequency divider 50 has a dividing ratio N, the feedforward signal 120 has a frequency $(1/N)\times f$ and an output signal 110 from the CFS 40 has a frequency $((N+b)/N)\times f$, where b may be +1 or −1. It is noted that the CFS circuit shown in FIG. 1*a* may be used as the CFS circuit 40 in this embodiment.

With an integer value of N, the device of FIG. 4 may produce a fractional output frequency equal to $((N+b)/N)\times f$. The ratio N of the frequency divider 50 may be fixed or programmable. If the frequency divider is programmable, then the fractional frequency multiplier device is also programmable. It is noted that N itself may be a fractional number.

Figure 5:
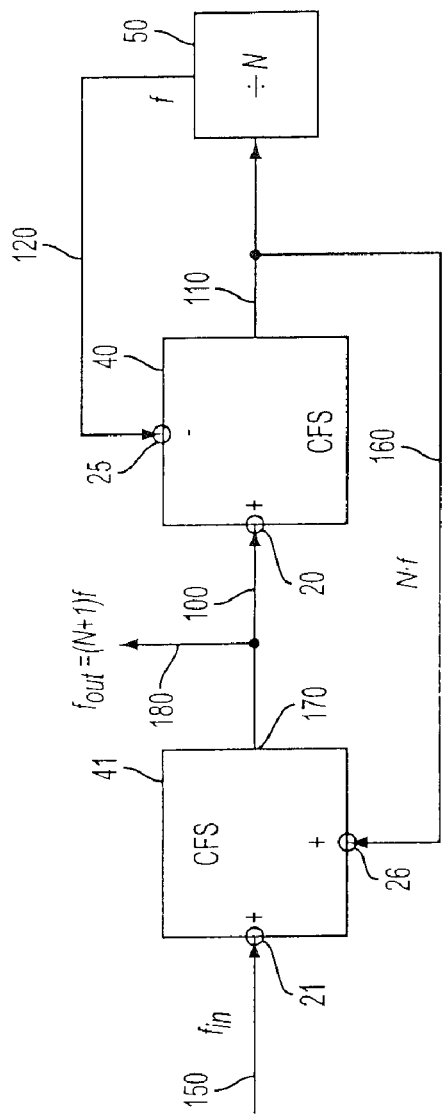
FIG. 5 is an exemplary block diagram of a fourth embodiment of a frequency multiplier operable for performing a regenerative integer frequency multiplication in accordance with the present invention.

Fractional frequency multiplier devices shown in FIG. 2 or FIG. 4 may be used for another regenerative frequency multiplier circuit, for either integer multiplication or fractional multiplication. FIG. 5 shows an example of a fourth embodiment of the present invention, which is utilized to obtain an integer frequency multiplier device. In FIG. 5, a first signal combiner, for example a first CFS 40, and a frequency divider 50 are arranged in a feedback configuration in the same manner as shown in FIG. 2. A second signal combiner, for example a second CFS 41, is also coupled to the circuit in a feedback configuration. The second CFS 41 is configured to receive an input signal 150 having a frequency $f_{in}$ at its first port 21 and configured for the USB conversion (b=+1). The output 110 from the first CFS 40 is coupled to the second port 26 of the second CFS 41 with a feedback connection. The output signal 170 from the second CFS 41 is coupled to the first port of the first CFS 40. The regenerative frequency multiplier circuit of FIG. 5 may produce the output signal 180 having an output frequency $f_{out}=(N+1)\times f_{in}$. It is noted that the first CFS 40 is configured for the LSB conversion, while the second CFS 41 is configured for the USB conversion. The circuit of FIG. 5 effectively converts a frequency division operation of the divider 50 into a frequency multiplication operation. By this configuration, multiplication by a large number may be achieved. For example, using a divider having a dividing ratio of 19, the circuit of FIG. 5 may yield multiplication by a factor of 20. It is noted that the CFS circuit shown in FIG. 1*a* may be used as the CFS circuit 40 or 41 in this embodiment.

Figure 6:
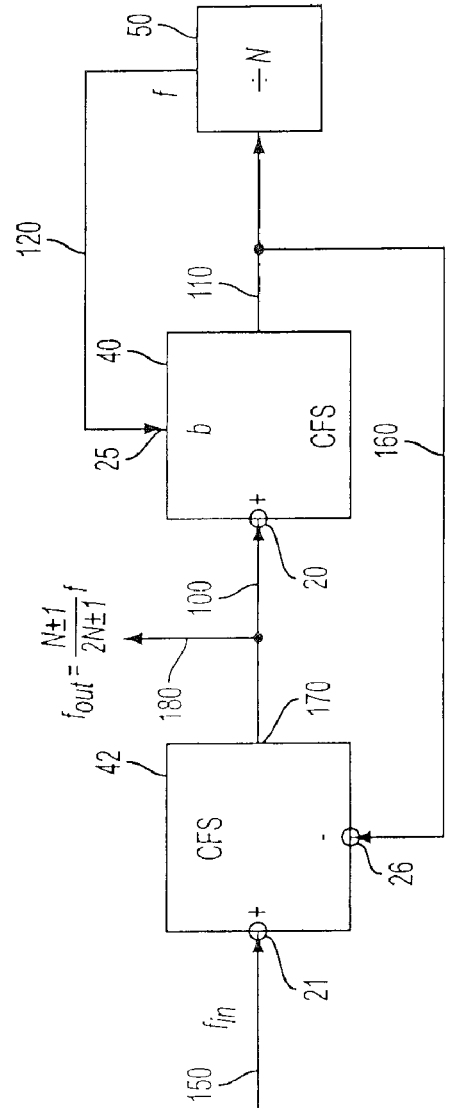
FIG. 6 is an exemplary block diagram of a fifth embodiment of a frequency multiplier operable for performing a regenerative fractional frequency multiplication in accordance with the present invention.

In addition, a fractional multiplication operation may be achieved by using the same configuration as shown in FIG. 5, except with a different sideband selection. FIG. 6 shows an example of a fifth embodiment of the present invention, to obtain a fractional frequency multiplier device. In FIG. 6, a second signal combiner, for example a second CFS 42, is configured for the LSB conversion, while the first CFS 40 may be configured either for the LSB or USB conversion (b=−1 or +1, respectively). In this case, the regenerative frequency multiplier circuit of FIG. 6 may produce an output signal 180 having an output frequency $f_{out}=((N\pm1)/(2N\pm1))\times f_{in}$, where the plus sign in this equation is obtained with b=−1 and the minus sign with b=+1. It is noted that the CFS circuit shown in FIG. 1*a* may be used as the CFS circuit 40 or 42 in this embodiment.

FIG. 7 shows an example of a sixth embodiment of the present invention, to obtain an integer frequency multiplier device. In FIG. 7, a first signal combiner, for example a first CFS 40, and a frequency divider 50 are arranged in a feedforward configuration as shown in FIG. 4. A second signal combiner, for example a second CFS 43, is also coupled to the circuit in a feedback configuration. The second CFS is configured to receive an complex input signal 150 having a frequency $f_{in}$ at its first port 23. The output signal 110 from the first CFS 40 is coupled to the second port 28 of the second CFS 43 with a feedback connection. The output 170 from the second CFS 43 is coupled to the first port 20 of the first CFS 40 and to the frequency divider 50. The regenerative frequency multiplier circuit of FIG. 7 may produce the output signal 180 having an output frequency $f_{out}=N\times f_{in}$. It is noted that the first CFS 40 is configured for the LSB conversion, while the second CFS 43 is configured for the USB conversion. The circuit of FIG. 7 effectively converts a frequency division operation of the divider 50 into a frequency multiplication operation. By this configuration, multiplication by a large number may be achieved. For example, using a divider with dividing ratio of 20, the circuit of FIG. 7 may yield multiplication by a factor of 20. It is noted that the CFS circuit shown in FIG. 1a may be used as the CFS circuit 40 or 43 in this embodiment.

In addition, a fractional multiplication operation may be achieved by using the same configuration as in FIG. 7, except with a different sideband selection. FIG. 8 shows an example of a seventh embodiment of the present invention, to obtain a fractional frequency multiplier device. In FIG. 8, a second signal combiner, for example a second CFS 44, is configured for the LSB conversion, while the first CFS 40 may be configured either for the LSB or USB conversion (b=−1 or +1, respectively). In this case, the regenerative frequency multiplier circuit of FIG. 8 may produce an output signal 180 having an output frequency $f_{out} = (N/(2N \pm 1)) \times f_{in}$, where the plus sign in this equation is obtained with b=−1 and the minus sign with b=+1. It is noted that the CFS circuit shown in FIG. 1a may be used as the CFS circuit 40 or 42 in this embodiment.

Figure 9:
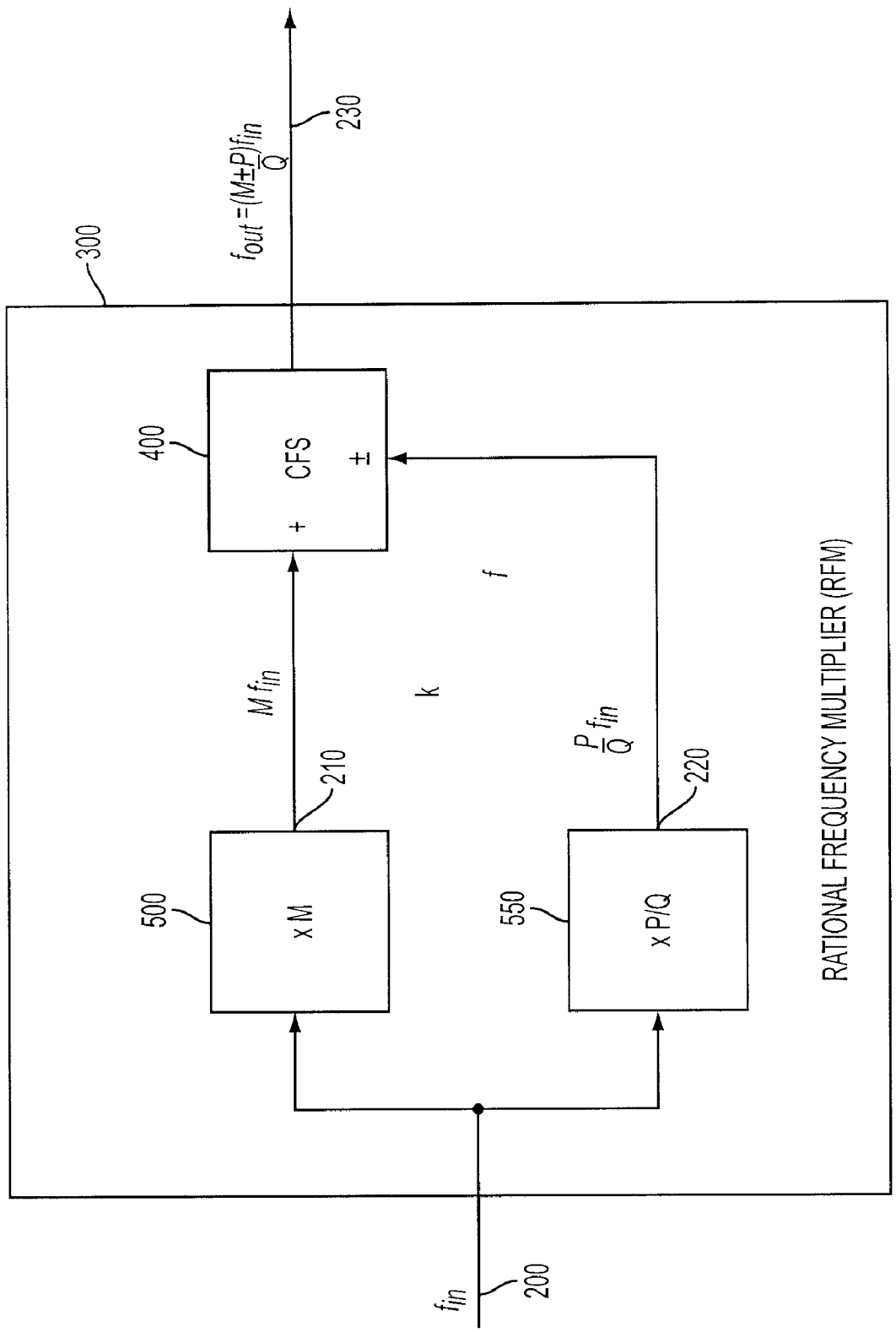
FIG. 9 is an exemplary block diagram of an eighth embodiment of a frequency multiplier operable for performing a regenerative rational frequency multiplication in accordance with the present invention.

The integer and fractional frequency multiplier devices shown above may be used in a rational frequency multiplier device. FIG. 9 shows an exemplary block diagram of an eighth embodiment of the present invention, to achieve a rational frequency multiplier (RFM). In FIG. 9, the RFM 300 may comprise a CFS 400, an integer frequency multiplier circuit 500 and a fractional frequency multiplier circuit 550. The multiplication products of the input frequency $f_{in}$ with integer (M) and fractional (P/Q) numbers are added or subtracted with a Complex Frequency Shifter (CFS) to produce output frequency $f_{out}$. The input signal 200 having the input frequency $f_{in}$ is coupled to the integer frequency multiplier circuit 500 and the fractional frequency multiplier circuit 550. The output signal 210 from the integer frequency multiplier circuit 500 may be coupled to the first port of the CFS 400 and the output signal 220 from the fractional frequency multiplier circuit 550 may be coupled to the second port of the CFS 400. The output signal 230 from the CFS 400 has a frequency equal to $f_{out} = (M \pm P/Q) \times f_{in}$.

As the integer frequency multiplier circuit 500, any of the frequency multiplier circuits shown in FIGS. 2, 5 and 7 may be used. As the fractional frequency multiplier circuit 550, any of the frequency multiplier circuits shown in FIGS. 2-8 may be used. It is noted that the CFS circuit shown in FIG. 1a may be used as the CFS circuit 400 in FIG. 9.

The RFM output may be used as a stand-alone signal source and/or used in a Rational Frequency Synthesizer (RFS). The RFS of the present invention shown in FIG. 11 may comprise a PLL circuit including the RFM shown in FIG. 9 and a Phase-Frequency Detector (PFD) described in the aforementioned related application No. 20060057996 "High frequency low noise phase-frequency detector and phase noise reduction method and apparatus," which is applicable at a broad range of frequencies from near DC to high GHz frequencies close to $f_T$.

Figure 10:
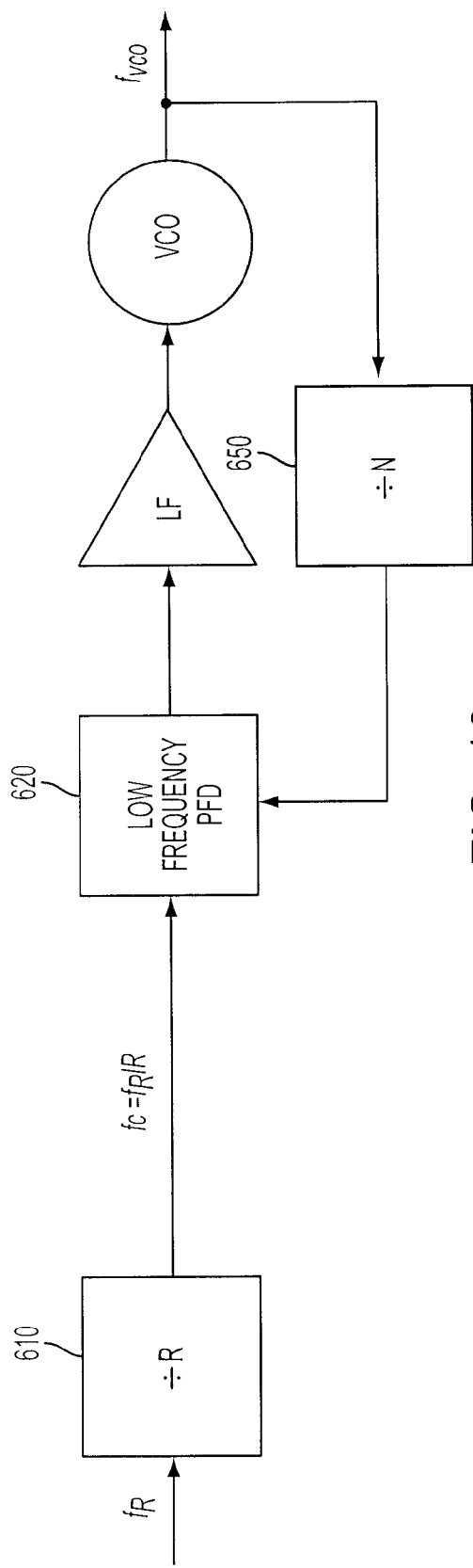
FIG. 10 is a block diagram of a prior art PLL with a Phase-Frequency Detector (PFD).

FIG. 10 shows a block diagram of a prior art PLL with a PFD operating at low frequencies. The PLL employs frequency divider 610 at its input to produce a lower comparison frequency $f_C$ from the reference frequency $f_R$. The PLL also employs another frequency divider 650 for VCO frequency in the feedback loop. In this configuration of the prior art, the noise of the frequency dividers and the PFD noise get multiplied by the loop (by a factor equal to N), which causes phase noise degradation of the output signal $f_{VCO}$. This degradation can be substantial when N is large.

Figure 11:
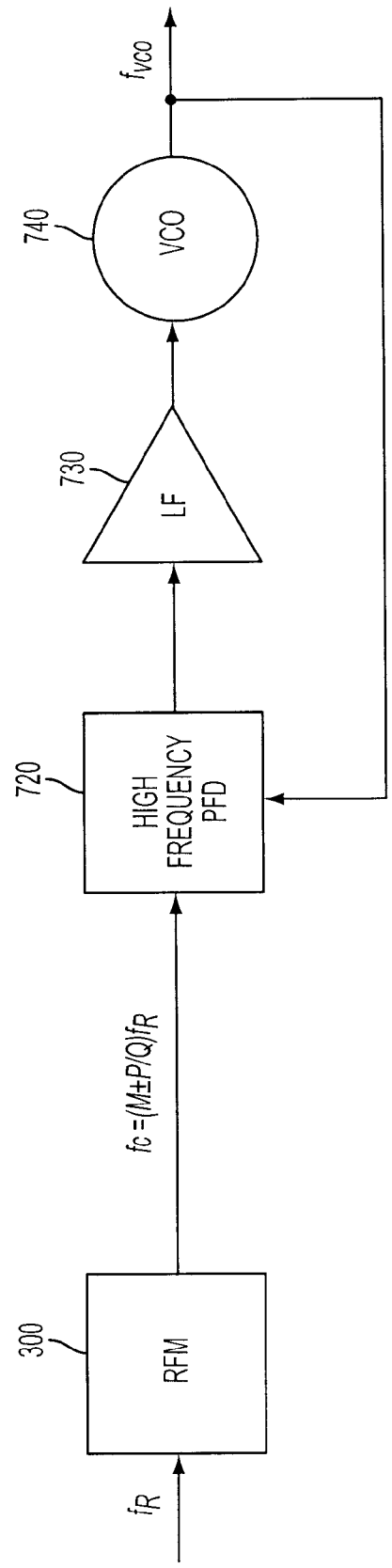
FIG. 11 is an exemplary block diagram of a PLL with a Phase-Frequency Detector (PFD) in accordance with the present invention.

On the other hand, the RFS of the present invention does not degrade the phase noise appreciably. This is primarily because there is no noise multiplication in the RFS loop since the phase comparison is accomplished directly at the output frequency, as described below. FIG. 11 shows an exemplary block diagram of PLL (RFS) with a Phase-Frequency Detector (PFD) of the present invention.

The PLL of FIG. 11 in the given embodiment comprises a rational frequency multiplier (RFM) 300, a phase-frequency detector (PFD) 720 configured to receive an output signal from the RFM 300, a low pass filter 730 configured to receive an output signal from the PFD 720 and a voltage-controlled oscillator (VCO) 740 configured to receive an output signal from the low pass filter 730 wherein an output from the VCO 740 is coupled to the PFD by a feedback connection. It is noted that any of RFM's described above may be used as the RFM of FIG. 11.

In FIG. 11, both multiplier RFM 300 and the PFD 720 are capable of operating at broad frequency range, from near DC to high GHz frequencies close to $f_T$. Unlike the prior art, the PLL of the present invention phase-locks the VCO frequency $f_{VCO}$ directly to the comparison frequency $f_C$ of the output signal of the low phase noise RFM 300, such that $f_{VCO} = f_C$. It is noted that low phase noise of the RFM 300 and absence of dividers in the PLL (thus no noise multiplication in the loop) along with low noise PFD insure the low phase noise of the output signal $f_{VCO}$. The RFS PLL of the present invention also works with a divider in the feedback path, inserted between the VCO output and the feedback input of the PFD (not shown in the figure). This embodiment may be used for instance to phase lock a very high frequency VCO, exceeding the RFM/PFD frequency capability. In this embodiment, the VCO phase noise degradation related to the divider ratio and subsequent noise multiplication in the loop would occur.

It is noted that any of the circuits shown in FIGS. 1-11 may be integrated in one or more IC's.

One of the advantages associated with the present invention is the use of the CFS circuit 40. The acquisition of the multiplication signal and subsequent delivery of the multiplied signals at the output of both the in-phase and quadrature components is very fast, on the order of the propagation delay time τ through the circuit. With high frequency IC processes, the time delay τ can be extremely small. For example, with $f_T$ of 25 GHz, the delay τ is on the order of a few tens of picoseconds. The fast response of the CFS circuit 40 is possible because there are no other delay mechanisms (such as filter delays or similar) in the circuit besides the core delay τ to slow the signal down, as is the case with some prior art solutions. Thus, the in-phase and quadrature components of the multiplied signal of CFS circuit 40 will be generated and provided at the output very fast, substantially instantaneously upon application of the input signal (to the extent of the speed of generation and availability of the quadrature signals at the input) incurring only minimum delay equal to the propagation delay τ. This is a valuable feature for applications requiring very fast frequency hopping, such as in spread-spectrum systems and other fast signal switching applications.

Another advantage associated with the present invention is that very low phase-noise and broadband noise are achievable with the CFS circuit 40. The output noise in the CFS circuit 40 is a function of the following factors: the noise figures of the input ports, the magnitude of the signal levels applied to these ports and the effects of the multiplication process. The close-in phase noise of the CFS circuit is governed by the close-in flicker noise of the mixers, while the broadband noise of the CFS circuit is governed by the noise figure of the mixers. Particularly suitable mixers providing low noise and high signal level capability for use in the present invention include, but are not limited to, analog or RF types such as single or double-balanced mixers with diodes or active-switches, and Gilbert-cell based mixers. It is noted that very low noise figures and flicker noise levels are achievable with mixers, including the ones integrated in ICs implementation, with low noise figures resulting in noise floors not far from the thermal noise of −174 dBm/Hz and very low flicker noise corners below 1 kHz, providing extremely low close-in phase noise. By using mixers with higher compression points capable of handling high signal levels and increasing the signal drive levels it is possible with the CFS circuit 40 to achieve a very high output SNR in excess of 170 dBc/Hz. For example, 170 dBc/Hz SNR can be realized with a multiplier having a noise figure of 12 dB and an output signal level of +8 dBm, readily achievable with today's ICs.

As is known, frequency multiplication increases the noise. For example, frequency doubling increases the phase noise voltage by a factor of 2 (this is because doubling of the frequency also doubles the index of phase modulation caused by noise, thus doubling the noise voltage) which translates into the phase noise power increase of 4 times or 6 dB. The phase noise in general represents only half of the broadband noise power and the other half is the amplitude noise. Due to a signal limiting that may occur in the present invention frequency multiplier, some of the amplitude noise may be converted into phase noise, making the phase noise dominant. When multiple CFS circuits 40 are connected in a cascaded configuration as shown, for example, in FIG. 3, the output noise is dominated by the noise power of the first stage in the cascade which gets multiplied by the square of the cascade's frequency multiplication ratio.

The present invention provides numerous advantages over prior art frequency multiplier circuits. Most importantly, the present invention provides a circuit for low noise frequency multiplication by integer factors and/or fractional factors. The circuit can simultaneously achieve both low phase noise and low broadband noise, for the reasons described above. The low broadband noise is especially important in some applications, for example, when generating high-frequency low-jitter clock signals or when used as an LO for a frequency conversion of large number of carriers/channels.

Another advantage associated with the present invention is that it provides for low noise multiplication of a reference frequency by an arbitrary rational number.

Another advantage associated with the present invention is that it provides a frequency multiplier device which achieves very wide frequency range of operation from low frequencies near DC to very high frequencies close to the transition frequency $f_T$ of the active devices utilized.

Another advantage of the present invention is that it provides a fractional regenerative frequency multiplier device which simplifies cascading of multiple stages by directly interconnecting the cascaded stages without the need for additional circuitry to produce simultaneously a series of fractional output frequencies.

Yet another advantage of the present invention is that it provides the output in-phase and quadrature components I and Q of the multiplied signal for use as a source of quadrature signals to be utilized by other components in the system.

Yet another advantage of the present invention is that it provides a frequency multiplier apparatus which provides for fast acquisition of the input signal and provides the in-phase and quadrature components of the output multiplied signal with minimal delay, using little or no filtering thus not slowing down the acquisition and multiplication process.

Yet another advantage of the present invention is that it provides a frequency multiplier apparatus which achieves low radiated and conducted EMI emissions in order to reduce unwanted signal coupling or ingress into other circuits in densely populated designs, such as in monolithic ICs.

Although certain specific embodiments of the present invention have been disclosed, it is noted that the present invention may be embodied in other forms without departing from the spirit or essential characteristics thereof. Thus, the present embodiments are therefore to be considered in all respects as illustrative and not restrictive, the scope of the invention being indicated by the appended claims, and all changes that come within the meaning and range of equivalency of the claims are therefore intended to be embraced therein.

What is claimed is:

1. A frequency multiplier device, comprising:
a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency; and
a frequency divider having a dividing ratio N, the frequency divider configured to output a divided signal,
wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$,
further comprising a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner and the output from the second signal combiner is coupled to the first port of the first signal combiner, and
wherein, when the first signal combiner provides the output signal having the difference of the first frequency and the second frequency and the second signal combiner provides the output signal having the sum of the third frequency and fourth frequency, the output signal from the second signal combiner has a frequency of $(N+1)\times f_3$.

2. A frequency multiplier device, comprising:
a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency; and
a frequency divider having a dividing ratio N, the frequency divider configured to output a divided signal,
wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$,
further comprising a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency, wherein the output from the first signal combiner is coupled to the second port of the second signal combiner and the output from the second signal combiner is coupled to the first port of the first signal combiner, and wherein, when the second signal combiner provides the output signal having the difference of the third frequency and fourth frequency, the output signal from the second signal combiner has a frequency of $((N\pm1)/(2N\pm1))\times f_3$.

3. A frequency multiplier device, comprising:

a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency; and a frequency divider having a dividing ratio N, the frequency divider configured to output a divided signal, wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$, wherein the first signal combiner comprises:

a first multiplier configured to receive a first component of a first complex input signal and a first component of a second complex input signal and to output a first multiplied signal;

a second multiplier configured to receive a second component of the first complex input signal and a second component of the second complex input signal and to output a second multiplied signal;

a third multiplier configured to receive the second component of the second complex input signal and the first component of the first complex input signal and to output a third multiplied signal;

a fourth multiplier configured to receive the first component of the first complex input signal and the second component of the second complex input signal and to output a fourth multiplied signal;

a first summer configured to receive the first and second multiplied signals and to output a first component of an output complex signal; and a second summer configured to receive the third and fourth multiplied signals and to output a second component of the output complex signal, wherein one of the first summer or the second summer is configured to operate as an adder and the other is configured to operate as a subtracter.

4. The frequency multiplier device of claim 1, wherein at least one of the first signal combiner or the second signal combiner comprises: a first multiplier configured to receive a first component of a first complex input signal and a first component of a second complex input signal and to output a first multiplied signal; a second multiplier configured to receive a second component of the first complex input signal and a second component of the second complex input signal and to output a second multiplied signal; a third multiplier configured to receive the second component of the second complex input signal and the first component of the first complex input signal and to output a third multiplied signal; a fourth multiplier configured to receive the first component of the first complex input signal and the second component of the second complex input signal and to output a fourth multiplied signal; a first summer configured to receive the first and second multiplied signals and to output a first component of an output complex signal; and a second summer configured to receive the third and fourth multiplied signals and to output a second component of the output complex signal, wherein one of the first summer or the second summer is configured to operate as an adder and the other is configured to operate as a subtracter.

5. The frequency multiplier device of claim 2, wherein at least one of the first signal combiner or the second signal combiner comprises:

a first multiplier configured to receive a first component of a first complex input signal and a first component of a second complex input signal and to output a first multiplied signal;

a second multiplier configured to receive a second component of the first complex input signal and a second component of the second complex input signal and to output a second multiplied signal;

a third multiplier configured to receive the second component of the second complex input signal and the first component of the first complex input signal and to output a third multiplied signal;

a fourth multiplier configured to receive the first component of the first complex input signal and the second component of the second complex input signal and to output a fourth multiplied signal;

a first summer configured to receive the first and second multiplied signals and to output a first component of an output complex signal; and a second summer configured to receive the third and fourth multiplied signals and to output a second component of the output complex signal, wherein one of the first summer or the second summer is configured to operate as an adder and the other is configured to operate as a subtracter.

6. A frequency multiplier device, comprising:

a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency;

a frequency divider having a dividing ratio N, the frequency divider configured to output a divided signal, wherein the divided signal from the frequency divider is coupled to the second port of the first signal combiner, the frequency divider is configured to receive the first input signal, and the output signal from the first signal combiner has a frequency of $((N\pm1)/N)\times f_1$, further comprising a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency, wherein the output from the first signal combiner is coupled to the second port of the second signal combiner, and the output from the second signal combiner is coupled to the first port of the first signal combiner and to the frequency divider, wherein, when the first signal combiner provides the output signal having the difference of the first frequency and the second frequency and the second signal combiner provides the output signal having the sum of the third frequency and fourth frequency, the output signal from the second signal combiner has a frequency of N×$f_3$.

7. A frequency multiplier device, comprising:
a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency;
a frequency divider having a dividing ratio N, the frequency divider configured to output a divided signal,
wherein the divided signal from the frequency divider is coupled to the second port of the first signal combiner, the frequency divider is configured to receive the first input signal, and the output signal from the first signal combiner has a frequency of ((N±1)/N)×$f_1$,
further comprising a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner, and the output from the second signal combiner is coupled to the first port of the first signal combiner and to the frequency divider,
wherein, when the second signal combiner provides the output signal having the difference of the third frequency and fourth frequency, the output signal from the second signal combiner has a frequency of (N/(2N±1))×$f_3$.

8. A frequency multiplier device, comprising:
a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency;
a frequency divider having a dividing ratio N, the frequency divider configured to output a divided signal,
wherein the divided signal from the frequency divider is coupled to the second port of the first signal combiner, the frequency divider is configured to receive the first input signal, and the output signal from the first signal combiner has a frequency of ((N±1)/N)×$f_1$,
wherein the first signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

9. The frequency multiplier device of claim 6, wherein at least one of the first signal combiner or the second signal combiner comprises: a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal;
and a second summer configured to receive the third and fourth multiplied signals and to output a second component of the output complex signal, wherein one of the first summer or the second summer is configured to operate as an adder and the other is configured to operate as a subtracter.

10. The frequency multiplier device of claim 7, wherein at least one of the first signal combiner or the second signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal, wherein one of the first summer or the second summer is configured to operate as an adder and the other is configured to operate as a subtracter.

11. A rational frequency multiplier, comprising:
an integer multiplier having a multiplication ratio M and configured to receive a signal having a frequency fin and to output an integer multiplied signal having a frequency M×fin;
a fractional multiplier having a multiplication ratio P/Q and configured to receive the signal having the frequency fin and to output an fractional multiplied signal having a frequency P/Q×fin; and
a signal combiner configured to combine the integer multiplied signal and the fractional multiplied signal and to output an rational multiplied signal having either a sum frequency (M+P/Q)×fin or a difference frequency (M−P/Q)×fin,
wherein the signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

12. A rational frequency multiplier, comprising:
an integer multiplier having a multiplication ratio M and configured to receive a signal having a frequency fin and to output an integer multiplied signal having a frequency M×fin;
a fractional multiplier having a multiplication ratio P/Q and configured to receive the signal having the frequency fin and to output an fractional multiplied signal having a frequency P/Q×fin; and
a signal combiner configured to combine the integer multiplied signal and the fractional multiplied signal and to output an rational multiplied signal having either a sum frequency (M+P/Q)×fin or a difference frequency (M+P/Q)×fin,
wherein the integer multiplier includes:
a first signal combiner having a first port for receiving a first input signal having a first frequency $f_1$ and a second port for receiving a second input signal having a second frequency $f_2$, the first signal combiner being configured to provide an output signal having either a sum of the first frequency and second frequency or a difference of the first frequency and second frequency; and
a frequency divider having a dividing ratio N, the frequency divider configured to output a divided signal,
wherein the output signal from the first signal combiner is coupled to the frequency divider, the divided signal from the frequency divider is coupled to the second port of the first signal combiner, and the output signal from the first signal combiner has a frequency of $(N/(N\pm1))\times f_1$.

13. The rational frequency multiplier of claim 12, wherein the integer multiplier further includes:
a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner and the output from the second signal combiner is coupled to the first port of the first signal combiner, and
wherein, when the first signal combiner provides the output signal having the difference of the first frequency and the second frequency and the second signal combiner provides the output signal having the sum of the third frequency and fourth frequency, the output signal from the second signal combiner has a frequency of $(N+1)\times f_3$.

14. The rational frequency multiplier of claim 12, wherein the integer multiplier further includes:
a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner and the output from the second signal combiner is coupled to the first port of the first signal combiner, and
wherein, when the second signal combiner provides the output signal having the difference of the third frequency and fourth frequency, the output signal from the second signal combiner has a frequency of $((N\pm1)/(2N\pm1))\times f_3$.

15. A rational frequency multiplier, comprising:
an integer multiplier having a multiplication ratio M and configured to receive a signal having a frequency fin and to output an integer multiplied signal having a frequency M×fin;
a fractional multiplier having a multiplication ratio P/Q and configured to receive the signal having the frequency fin and to output an fractional multiplied signal having a frequency P/Q×fin; and
a signal combiner configured to combine the integer multiplied signal and the fractional multiplied signal and to output an rational multiplied signal having either a sum frequency (M+P/Q)×fin or a difference frequency (M−P/Q)×fin,
wherein the integer multiplier includes:
a first signal combiner having a first port for receiving a first input signal having a first frequency $f_1$ and a second port for receiving a second input signal having a second frequency $f_2$, the first signal combiner configured to provide an output signal having either a sum of the first frequency and second frequency or a difference of the first frequency and second frequency;
a frequency divider having a dividing ratio N, the frequency divider configured to output a divided signal, wherein the divided signal from the frequency divider is coupled to the second port of the first signal combiner, the frequency divider is configured to receive the first input signal, and the output signal from the first signal combiner has a frequency of $((N\pm1)/N)\times f_1$.

16. The rational frequency multiplier of claim 15, wherein the integer multiplier further includes:
a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner, and the output from the second signal combiner is coupled to the first port of the first signal combiner and to the frequency divider,
wherein, when the first signal combiner provides the output signal having the difference of the first frequency and the second frequency and the second signal combiner provides the output signal having the sum of the third frequency and fourth frequency, the output signal from the second signal combiner has a frequency of $N\times f_3$.

17. The rational frequency multiplier of claim 15, wherein the integer multiplier further includes:
a second signal combiner having a first port for receiving a third input signal having a third frequency $f_3$ and a second port for receiving a fourth input signal having a fourth frequency $f_4$, the second signal combiner configured to provide an output signal having either a sum of the third frequency and fourth frequency or a difference of the third frequency and fourth frequency,
wherein the output from the first signal combiner is coupled to the second port of the second signal combiner, and the output from the second signal combiner is coupled to the first port of the first signal combiner and to the frequency divider,
wherein, when the second signal combiner provides the output signal having the difference of the third frequency and fourth frequency, the output signal from the second signal combiner has a frequency of $(N/(2N\pm1))\times f_3$.

18. A method of frequency multiplication comprising:
receiving a first input signal having a first frequency $f_1$ and a second input signal having a second frequency $f_2$ at a first signal combiner, the first signal combiner configured to provide an output signal having either a sum of the first frequency and second frequency or a difference of the first frequency and second frequency; and
outputting a divided signal at a frequency divider having a dividing ratio N,
wherein the output signal from the first signal combiner is coupled to the frequency divider, the divided signal from the frequency divider is coupled to the first signal combiner, and the output signal from the first signal combiner has a frequency of $(N/(N\pm1))\times f_1$,
receiving a third input signal having a third frequency $f_3$ and a fourth input signal having a fourth frequency $f_4$ at a second combiner, and providing an output signal having either a sum of the third frequency and fourth frequency or a difference of the third frequency and fourth frequency,
wherein the output from the first signal combiner is coupled to the second signal combiner and the output from the second signal combiner is coupled to the first signal combiner, and
wherein, when the first signal combiner provides the output signal having the difference of the first frequency and the second frequency and the second signal combiner provides the output signal having the sum of the third frequency and fourth frequency, the output signal from the second signal combiner has a frequency of $(N+1)\times f_3$.

19. A method of frequency multiplication comprising:
receiving a first input signal having a first frequency $f_1$ and a second input signal having a second frequency $f_2$ at a first combiner, the first signal combiner configured to provide an output signal having either a sum of the first frequency and second frequency or a difference of the first frequency and second frequency; and
outputting a divided signal at a frequency divider having a dividing ratio N,
wherein the output signal from the first signal combiner is coupled to the frequency divider, the divided signal from the frequency divider is coupled to the first signal combiner, and the output signal from the first signal combiner has a frequency of $(N/(N\pm1))\times f_1$,
receiving a third input signal having a third frequency $f_3$ and a fourth input signal having a fourth frequency $f_4$, at a second signal combiner, and providing an output signal having either a sum of the third frequency and fourth frequency or a difference of the third frequency and fourth frequency,
wherein the output from the first signal combiner is coupled to the second signal combiner and the output from the second signal combiner is coupled to the first signal combiner, and
wherein, when the second signal combiner provides the output signal having the difference of the third frequency and fourth frequency, the output signal from the second signal combiner has a frequency of $((N\pm1)/(2N\pm1))\times f_3$.

20. A method of frequency multiplication comprising:
receiving a first input signal having a first frequency $f_1$ and a second input signal having a second frequency $f_2$ at a first signal combiner, the first signal combiner configured to provide an output signal having either a sum of the first frequency and second frequency or a difference of the first frequency and second frequency; and
outputting a divided signal at a frequency divider having a dividing ratio N,
wherein the output signal from the first signal combiner is coupled to the frequency divider, the divided signal from the frequency divider is coupled to the first signal combiner, and the output signal from the first signal combiner has a frequency of $(N/(N\pm1))\times f_1$,
wherein the first signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;

a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

21. The method of claim 18, wherein at least one of the first signal combiner or the second signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

22. The method of claim 19, wherein at least one of the first signal combiner or the second signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

23. A method of frequency multiplication, comprising:
receiving a first input signal having a first frequency $f_1$ and a second port for receiving a second input signal having a second frequency $f_2$ at a first signal combiner configured to provide an output signal having either a sum of the first frequency and second frequency or a difference of the first frequency and second frequency;
outputting a divided signal at a frequency divider having a dividing ratio N, the frequency divider,
wherein the divided signal from the frequency divider is coupled to the second port of the first signal combiner, the frequency divider is configured to receive the first input signal, and the output signal from the first signal combiner has a frequency of $((N\pm1)/N)\times f_1$,
receiving a third input signal having a third frequency $f_3$ and a fourth input signal having a fourth frequency $f_4$, at a second signal combiner configured to provide an output signal having either a sum of the third frequency and fourth frequency or a difference of the third frequency and fourth frequency,
wherein the output from the first signal combiner is coupled to the second signal combiner, and the output from the second signal combiner is coupled to the first signal combiner and to the frequency divider,
wherein, when the first signal combiner provides the output signal having the difference of the first frequency and the second frequency and the second signal combiner provides the output signal having the sum of the third frequency and fourth frequency, the output signal from the second signal combiner has a frequency of $N\times f_3$.

24. The method of claim 23, wherein at least one of the first signal combiner or the second signal combiner comprises:
a first multiplier configured to receive a first component of a first complex input signal and a first component of a second complex input signal and to output a first multiplied signal;
a second multiplier configured to receive a second component of the first complex input signal and a second component of the second complex input signal and to output a second multiplied signal;
a third multiplier configured to receive the second component of the second complex input signal and the first component of the first complex input signal and to output a third multiplied signal;
a fourth multiplier configured to receive the first component of the first complex input signal and the second component of the second complex input signal and to output a fourth multiplied signal;
a first summer configured to receive the first and second multiplied signals and to output a first component of an output complex signal; and
a second summer configured to receive the third and fourth multiplied signals and to output a second component of the output complex signal,
wherein one of the first summer or the second summer is configured to operate as an adder and the other is configured to operate as a subtracter.

25. A method of frequency multiplication, comprising:
receiving a signal having a frequency fin at an integer multiplier having a multiplication ratio M and configured to and to output an integer multiplied signal having a frequency M×fin;
receiving the signal having the frequency fin a fractional multiplier having a multiplication ratio P/Q and configured to output an fractional multiplied signal having a frequency P/Q×fin; and combining, at a combiner, the integer multiplied signal and the fractional multiplied signal and to output an rational multiplied signal having either a sum frequency $(M+P/Q) \times fin$ or a difference frequency $(M-P/Q) \times fin$, wherein the signal combiner comprises:

a first multiplier configured to receive a first component of a first complex input signal and a first component of a second complex input signal and to output a first multiplied signal;

a second multiplier configured to receive a second component of the first complex input signal and a second component of the second complex input signal and to output a second multiplied signal;

a third multiplier configured to receive the second component of the second complex input signal and the first component of the first complex input signal and to output a third multiplied signal;

a fourth multiplier configured to receive the first component of the first complex input signal and the second component of the second complex input signal and to output a fourth multiplied signal;

a first summer configured to receive the first and second multiplied signals and to output a first component of an output complex signal; and a second summer configured to receive the third and fourth multiplied signals and to output a second component of the output complex signal, wherein one of the first summer or the second summer is configured to operate as an adder and the other is configured to operate as a subtracter.

* * * * *